United States Patent
Khan et al.

(10) Patent No.: US 10,915,486 B1
(45) Date of Patent: *Feb. 9, 2021

(54) INGRESS DATA PLACEMENT

(71) Applicant: Amazon Technologies, Inc., Seattle, WA (US)

(72) Inventors: Asif Khan, Cedar Park, TX (US); Thomas A. Volpe, Austin, TX (US); Marc John Brooker, Seattle, WA (US); Marc Stephen Olson, Bellevue, WA (US); Norbert Paul Kusters, Redmond, WA (US); Mark Bradley Davis, Austin, TX (US); Robert Michael Johnson, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/809,622

(22) Filed: Nov. 10, 2017

Related U.S. Application Data

(63) Continuation of application No. 14/752,294, filed on Jun. 26, 2015, now Pat. No. 9,817,786.

(51) Int. Cl.
| | |
|---|---|
| *G06F 13/42* | (2006.01) |
| *G11C 15/00* | (2006.01) |
| *G06F 11/10* | (2006.01) |

(52) U.S. Cl.
CPC .......... *G06F 13/4221* (2013.01); *G11C 15/00* (2013.01); *G06F 11/1064* (2013.01)

(58) Field of Classification Search
None
See application file for complete search history.

(56) References Cited

U.S. PATENT DOCUMENTS

| | | | |
|---|---|---|---|
| 7,117,301 B1 | 10/2006 | James et al. | |
| 7,249,192 B1 | 7/2007 | Brewer et al. | |
| 9,210,103 B1* | 12/2015 | Safrai | H04L 41/5041 |
| 9,274,851 B2 | 3/2016 | Cheung et al. | |
| 9,817,786 B1 | 11/2017 | Khan et al. | |
| 2006/0050722 A1 | 3/2006 | Bury et al. | |
| 2007/0115982 A1* | 5/2007 | Pope | H04L 45/742 370/392 |
| 2008/0307122 A1* | 12/2008 | Butler | H04L 49/90 710/23 |
| 2013/0198459 A1 | 8/2013 | Joshi et al. | |
| 2013/0282994 A1 | 10/2013 | Wires et al. | |
| 2013/0290957 A1 | 10/2013 | Li et al. | |

OTHER PUBLICATIONS

U.S. Appl. No. 14/752,294, "Non-Final Office Action", dated Sep. 23, 2016, 10 pages.
U.S. Appl. No. 14/752,294, "Notice of Allowance", dated Jul. 27, 2017, 8 pages.

* cited by examiner

*Primary Examiner* — Charles Rones
*Assistant Examiner* — Ryan Dare
(74) *Attorney, Agent, or Firm* — Weaver Austin Villeneuve & Sampson LLP

(57) ABSTRACT

Server computers often include one or more input/output (I/O) devices for communicating with a network or directly attached storage device. The data transfer latency for request can be reduced by utilizing ingress data placement logic to bypass the processor of the I/O device. For example, host memory descriptors can be stored in a memory of the I/O device to facilitate placement of the requested data.

20 Claims, 10 Drawing Sheets

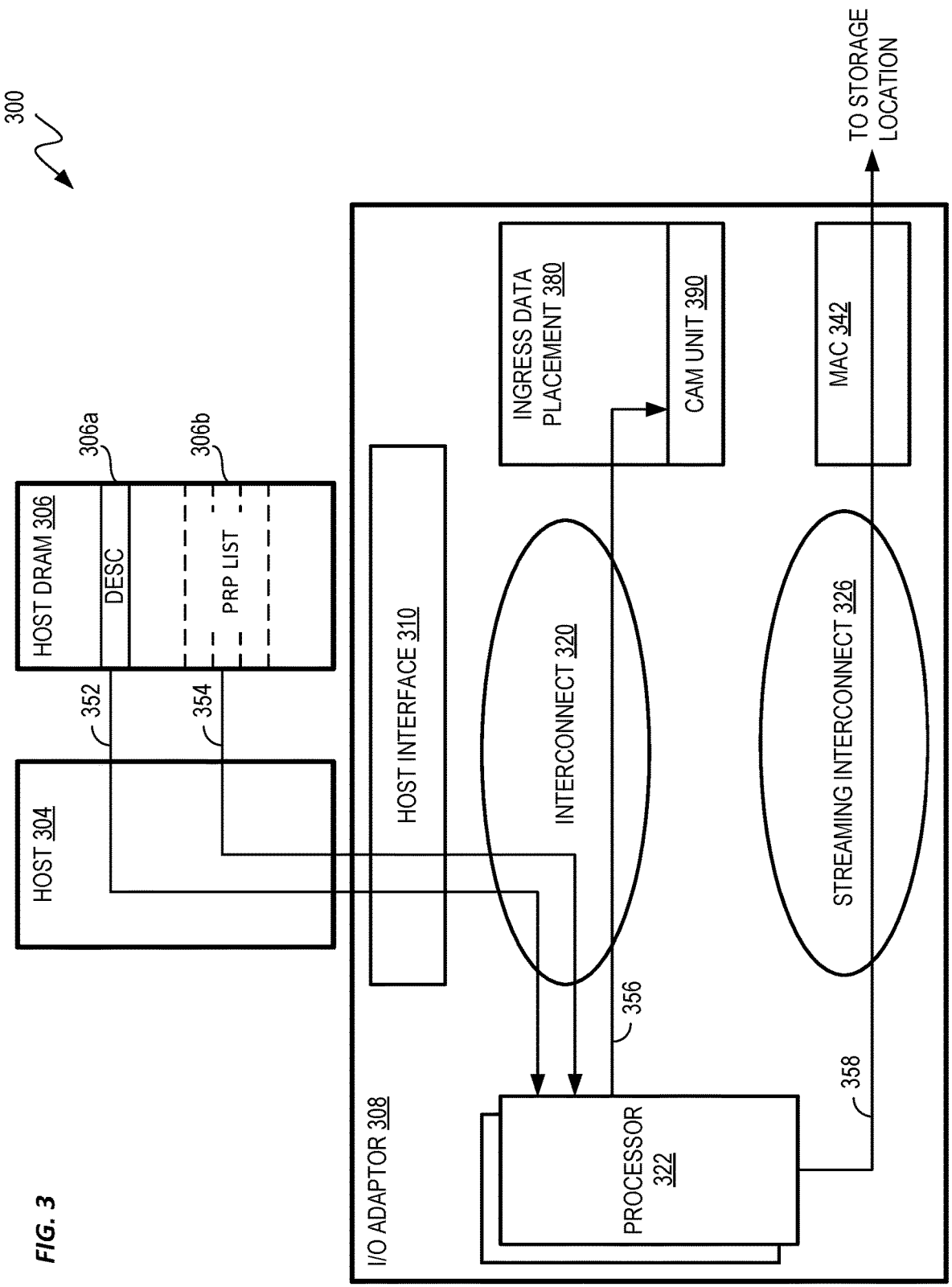

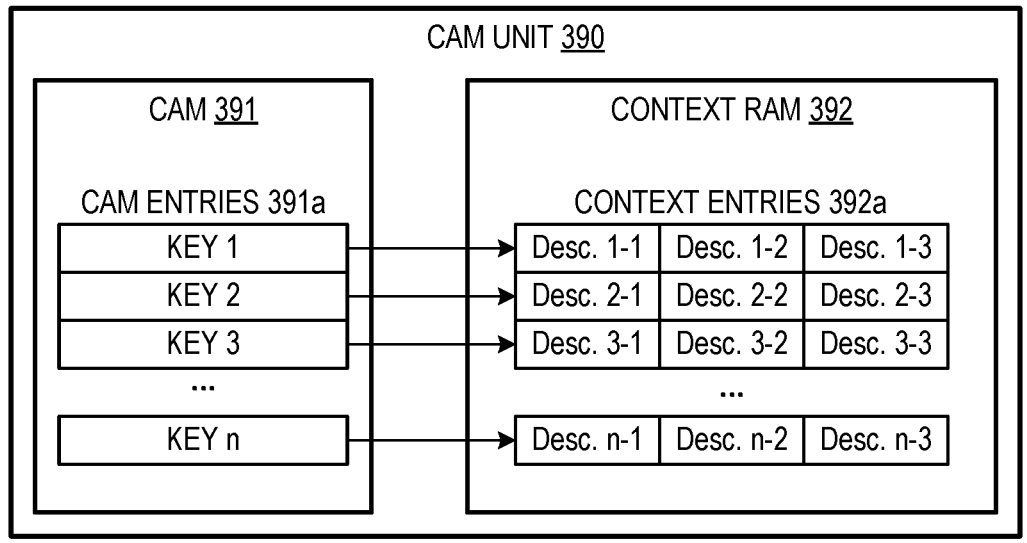
FIG. 5
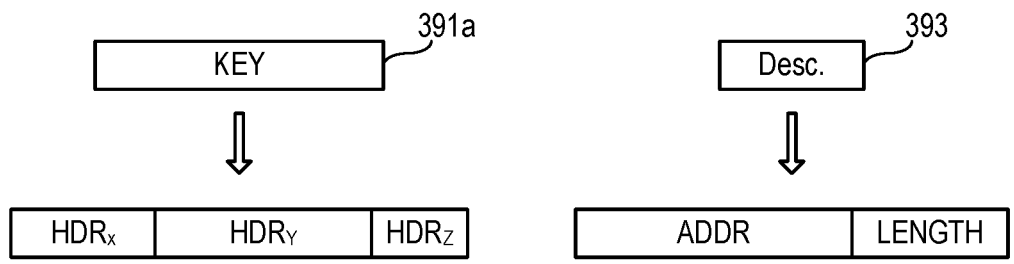
FIG. 6  FIG. 7
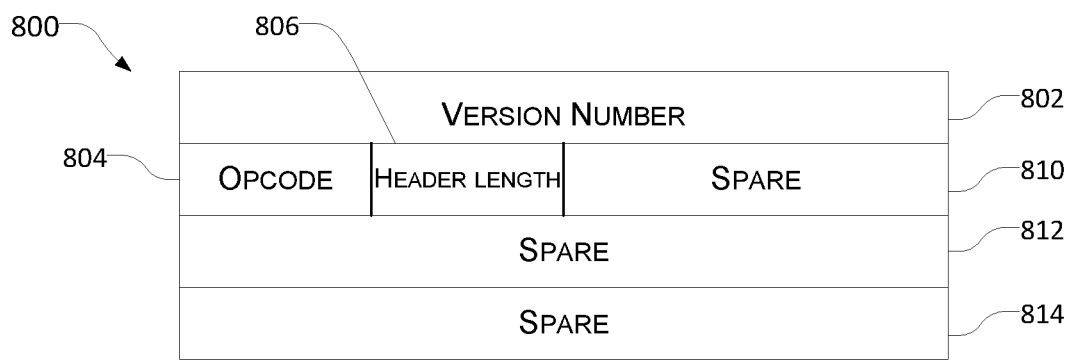
FIG. 8

INGRESS DATA PLACEMENT

CROSS-REFERENCE TO RELATED APPLICATIONS

This application is a continuation of U.S. patent application Ser. No. 14/752,294, filed on Jun. 26, 2015, now U.S. Pat. No. 9,817,786 issued on Nov. 14, 2017, entitled "INGRESS DATA PLACEMENT," the entirety of which is incorporated herein by reference.

BACKGROUND

Server computers often include one or more input/output (I/O) devices. For example, a server computer may include one or more I/O adapter devices for communicating with a network and/or a storage device. Each I/O device may communicate over multiple, possibly asynchronous interfaces, such as PCI Express (PCIe) and/or Ethernet. For example, a host server computer may send I/O transactions over a PCIe bus to the I/O adapter device, and the I/O adapter device may send those I/O transactions over an Ethernet cable for processing by another device. Some I/O adapter devices may include a controller (e.g., a processor) to manage and handle the I/O transactions. However, the additional processing performed by the I/O adapter device can add additional latency to the I/O transactions.

BRIEF DESCRIPTION OF THE DRAWINGS

Various embodiments in accordance with the present disclosure will be described with reference to the drawings, in which:

FIG. 3 illustrates a block diagram of a system for processing a request, according to some embodiments.

FIG. 5 illustrates a block diagram of a content addressable memory (CAM) unit, according to some embodiments.

FIG. 6 illustrates a CAM entry, according to some embodiments.

FIG. 7 illustrates a host memory descriptor, according to some embodiments.

FIG. 8 illustrates a header of a packet, according to some embodiments.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application-specific integrated circuit (ASIC) or System on Chip (SoC) comprising digital logic operable to send and receive packets.

A computing device (e.g., a host device) may communicate with an external entity using an I/O device. One example of an I/O device is an I/O adapter device that services I/O commands at the request of the host device. The I/O adapter device may include one or more processors to handle and manage data requests from the host device. For example, upon receiving a host device's request for data at a storage location, a processor of the I/O adapter device may send one or more request packets to the storage location to retrieve the data. The storage device at the storage location may send back one or more response packets to provide the requested data to the I/O adapter device. A processor of the I/O adapter device may then process the response packets and provide the requested data to the host device.

However, processing of the response packets by the processor of the I/O adapter device can add additional latency before the requested data is transferred to the host device. In order to reduce this latency and improve the speed of servicing requests, the techniques described herein implement specialized ingress data placement logic in the I/O adapter device to bypass the processor of the I/O adapter device when the I/O adapter device transfers the requested data from the storage location to the host device.

An I/O adapter device may be included in a system including a host computer and other components. The I/O adapter may further provide physical and virtual services to the host device and/or virtual processes running on the host device. These systems are described in further detail below.

I. Systems

Figure 1:
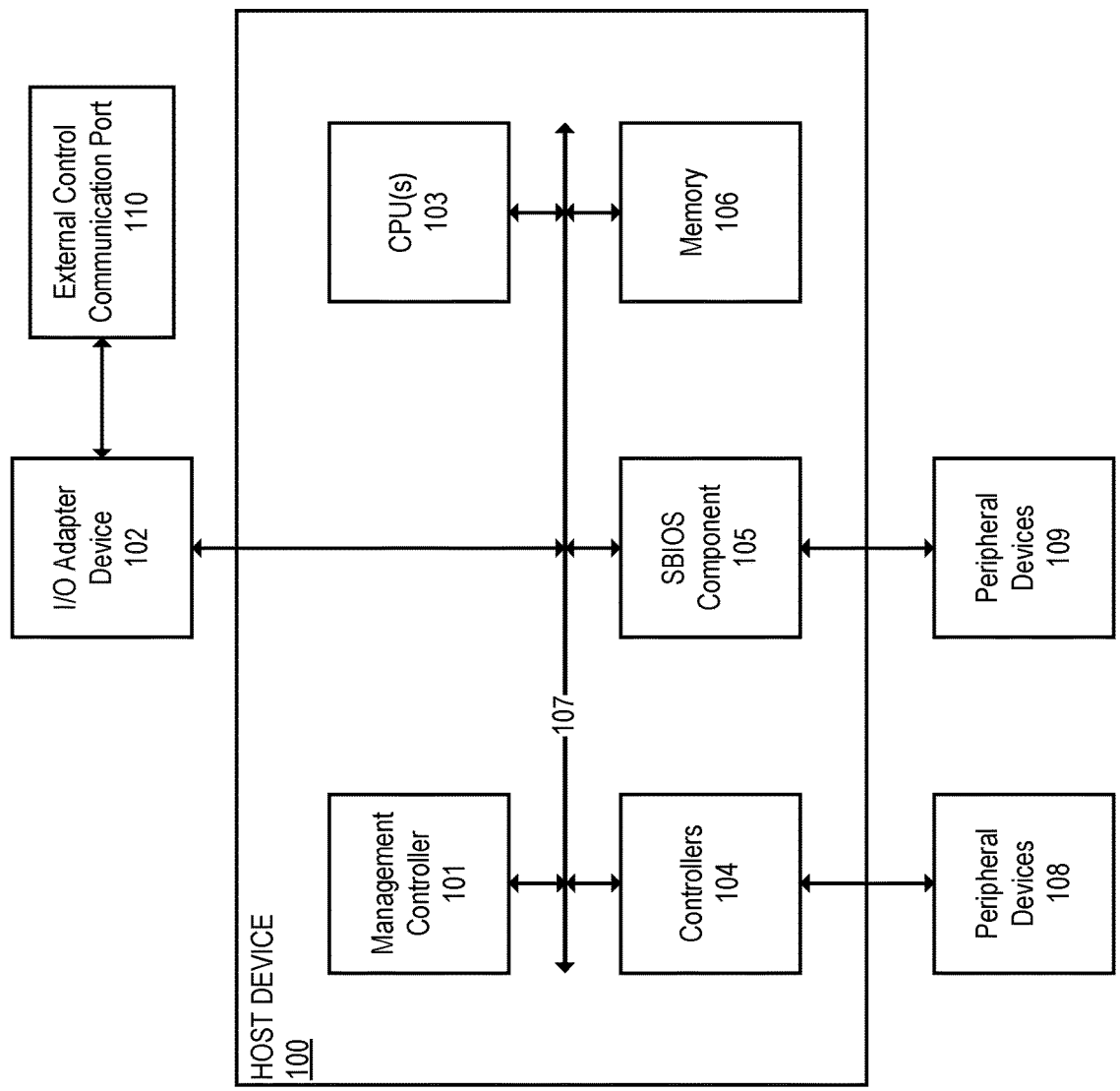
FIG. 1 illustrates a host device in communication with an I/O adapter device, according to some embodiments.

FIG. 1 shows a host device 100 in communication with an I/O adapter device 102 according to one embodiment. However, one skilled in the relevant art will appreciate that the disclosed illustrative components are not meant to be an exhaustive identification of all the components required by or present in a host device 100. Rather, illustrative components have been identified, in a non-limiting manner, to facilitate illustration of one or more aspects of the present application. Still further, the illustrative components of the host device 100 can be considered logical in nature such that the physical implementation of one or more components can be varied or such that one or more of the logical components may be implemented in a virtualized manner. Additionally, one or more host devices 100 can share one or more of the illustrated components, such as processors, graphical processing units, memory and the like.

In an illustrative embodiment, the host device 100 is associated with various hardware components, software components and respective configurations that facilitate the execution of low latency write requests, which will be described in detail below. Specifically, in one embodiment, host device 100 can include a management controller 101 for managing the operation of host device 100. Specifically, the management controller 101 can include an embedded microcontroller that manages the interface between system management software and host device 100 components.

In communication with the host device 100 is an I/O adapter device 102. Generally, the I/O adapter device 102 may include any device that inputs and/or outputs data along a communication channel 107. In one aspect, the I/O adapter device 102 can communicate as a standard bridge component for facilitating access between various physical and emulated components and a communication channel 107. In another aspect, the I/O adapter device 102 can include embedded microprocessors to allow the I/O adapter device to execute computer executable instructions related to the implementation of management functions or the management of one or more such management functions, or to execute other computer executable instructions related to the implementation of the I/O adapter device 102. In some embodiments, the I/O adapter device 102 may be implemented using multiple discrete hardware elements, such as multiple cards or other devices. The management controller 101 can be configured in such a way to be electrically isolated from any other component in the host device 100 other than the I/O adapter device 102. In some embodiments, the I/O adapter device 102 is attached externally to the host device 100. In some embodiments, the I/O adapter device 102 is internally integrated into the host device 100.

Also in communication with the I/O adapter device 102 may be an external communication port component 110 for establishing communication channels between the host device 100 and one or more network based services or other network-attached or direct-attached computing devices. Illustratively, the external communication port component 110 can correspond to a network switch, sometimes known as a Top of Rack ("TOR") switch. The I/O adapter device 102 can utilize the external communication port component 110 to maintain communication channels between one or more services and the host device 100, such as health check services, financial services, and the like.

The I/O adapter device 102 can also be in communication with a System Basic Input/Output System (SBIOS) component 105. The SBIOS component 105 can include non-transitory executable code, often referred to as firmware, which can be executed by one or more processors and used to cause components of the host device 100 to initialize and identify system devices such as the video display card, keyboard and mouse, hard disk drive, optical disc drive and other hardware. The SBIOS component 105 can also include or locate boot loader software that will be utilized to boot the host device 100. For example, in one embodiment, the SBIOS component 105 can include executable code that, when executed by a processor, causes the host device 100 to attempt to locate Preboot Execution Environment (PXE) boot software. Additionally, the SBIOS component 105 can include or takes the benefit of a hardware latch that is electrically controlled by the I/O adapter device 102. The hardware latch can restrict access to one or more aspects of the SBIOS component 105, such as controlling modifications or configurations of the executable code maintained in the SBIOS component 105.

The SBIOS component 105 can be connected to (or in communication with) a number of additional computing device resources components, such as central processing units ("CPUs") 103, memory 106 (e.g., RAM), and the like.

In one embodiment, such computing device resource components may be physical computing device resources in communication with other components via the communication channel 107. The communication channel 107 can correspond to one or more communication buses, such as a shared bus (e.g., a front side bus, a memory bus), a point-to-point bus such as a PCI or PCI Express bus, etc., in which the components of the bare metal host device 100 communicate. Other types of communication channels, communication media, communication buses or communication protocols (e.g., the Ethernet communication protocol) may also be utilized. Additionally, in other embodiments, one or more of the computing device resource components may be virtualized hardware components emulated by the host device 100. In such embodiments, the I/O adapter device 102 can implement a management process in which a host device is configured with physical or emulated hardware components based on a variety of criteria. The computing device resource components may be in communication with the I/O adapter device 102 via the communication channel 107. In addition, although communication channel 107 in FIG. 1 is shown as connecting all of components 101-106, it should be appreciated that a communication channel in accordance with some embodiments may connect any subset of the components 101-106 and/or other components. For example, a communication channel may connect a PCI Express device to a CPU via a northbridge or host bridge.

Also in communication with the I/O adapter device 102 via the communication channel 107 may be one or more controller components 104 for managing hard drives or other forms of memory. An example of a controller component 104 can be a SATA hard drive controller. Similar to the SBIOS component 105, the controller components 104 can include or take the benefit of a hardware latch that is electrically controlled by the I/O adapter device 102. The hardware latch can restrict access to one or more aspects of the controller component 104. Illustratively, the hardware latches may be controlled together or independently. For example, the I/O adapter device 102 may selectively close a hardware latch for one or more components based on a trust level associated with a particular customer. In another example, the I/O adapter device 102 may selectively close a hardware latch for one or more components based on a trust level associated with an author or distributor of the executable code to be executed by the I/O adapter device 102. In a further example, the I/O adapter device 102 may selectively close a hardware latch for one or more components based on a trust level associated with the component itself.

The host device 100 can also include additional components that are in communication with one or more of the illustrative components associated with the host device 100. Such components can include devices, such as one or more controllers 104 in combination with one or more peripheral devices 108, such as hard disks or other storage devices. Additionally, the additional components of the host device 100 can include another set of peripheral devices 109, such as Graphics Processing Units ("GPUs"). The peripheral devices 108 and 109 can also be associated with hardware latches for restricting access to one or more aspects of the component. As mentioned above, in one embodiment, the hardware latches may be controlled together or independently.

Figure 2:
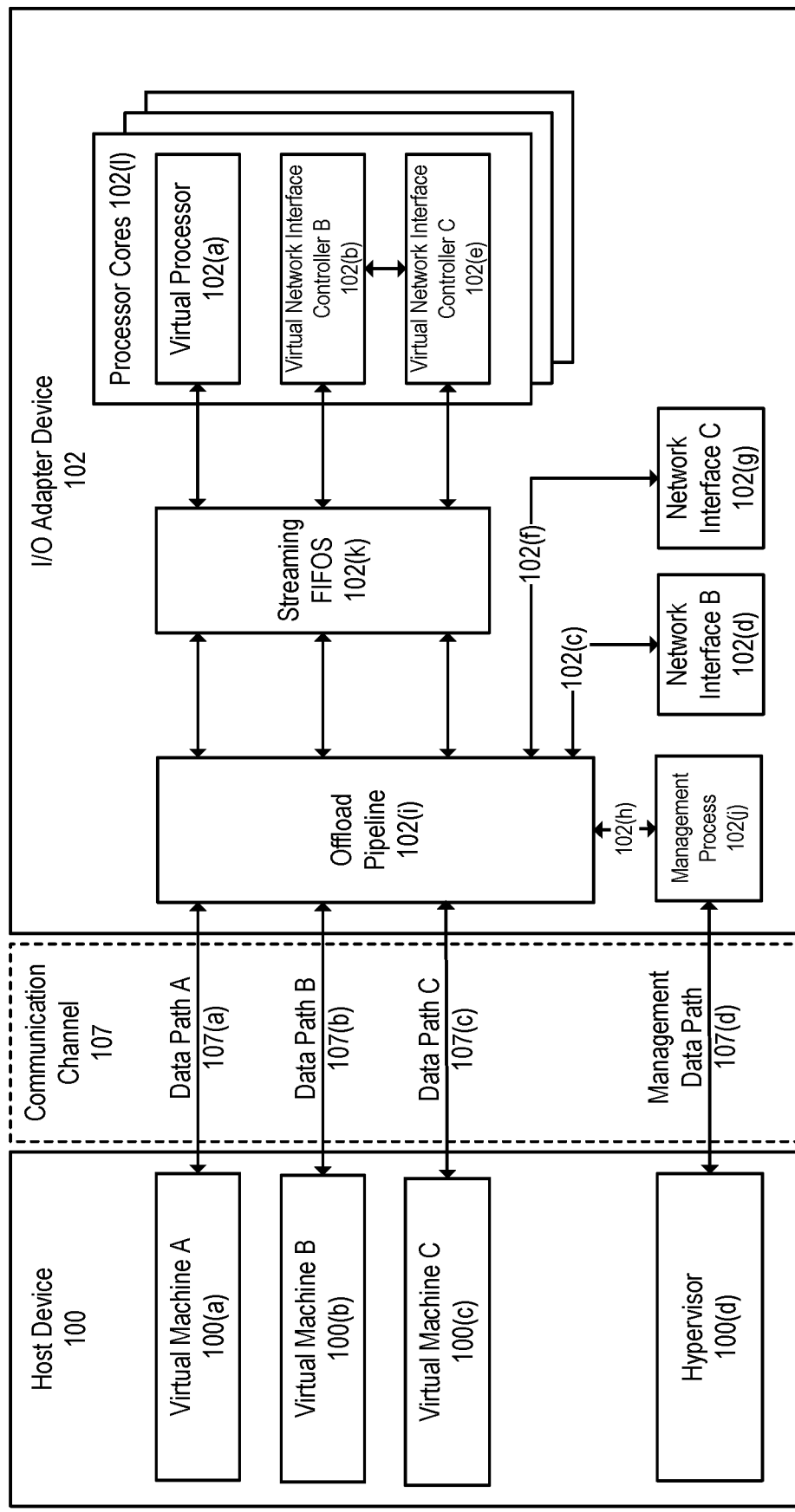
FIG. 2 illustrates communications between a host device and an I/O adapter device, according to some embodiments.

FIG. 2 illustrates communications between the host device 100 and the I/O adapter device 102, according to some embodiments. As shown in FIG. 2, the host device 100 may execute a plurality of processes, such as virtual machines A-C 100(*a*)-(*c*) and a hypervisor 100(*d*). The I/O adapter device 102 may include an offload pipeline 102(*i*) for receiving and handling requests from the virtual machines 100(*a*)-(*c*). The I/O adapter device 102 may also include one or more processor cores 102(1). The I/O adapter device 102 may emulate a plurality of devices, such as virtual processor 102(*a*), and virtual network interface cards 102(*b*), 102(*e*), using the processor cores 102(1). The I/O adapter device 102 may also include a management process 102(*h*). Each of the above-described components of the host device 100 and the I/O adapter device 102 may communicate using data paths 107(*a*)-(*d*) over communication channel 107.

Virtual machine A 100(*a*) may be any suitable emulation of a computer system. Virtual machine A 100(*a*) may be in communication with a virtual processor 102(*a*) via a data path A 107(*a*). The virtual processor 102(*a*) may include one or more processing elements such as microprocessors. For example, the virtual processor 102(*a*) may include a general purpose graphical processing unit (GP-GPU), an application-specific instruction-set processor (ASIP), or another specialized processing element that may be better suited for certain tasks (e.g., secure billing and transaction processing) than the host device 100.

Virtual machine B 100(*b*) may also be any suitable emulation of a computer system. Virtual machine B 100(*b*) may be in communication with a virtual network interface controller (NIC) B 102(*b*) via the data path B 107(*b*). The network interface B 102(*d*) may be any suitable interface to a computer network. In one example, the network interface B 102(*d*) may be a physical Ethernet port. In another example, the network interface B 102(*d*) may be a virtual network interface that shares the same physical Ethernet port with one or more other virtual network interfaces. Virtual machine C 100(*c*) may similarly be in communication with the network interface C 102(*g*).

The virtual machines 100(*a*)-(*c*) running on the host device 100 may be managed by a hypervisor 100(*d*). The hypervisor 100(*d*) may, for example, be configured to create, start, monitor, stop, and delete virtual machines 100(*a*)-(*c*). In addition, the hypervisor 100(*d*) may be configured to communicate with a management process 102(*g*) on the I/O adapter device 102 via a management data path 107(*d*). The management process 102(*g*) may be used to, for example, create or remove virtual devices such as the virtual offload processor 102(*a*), the virtual NIC B 102(*b*), and/or the virtual NIC C 102(*e*) and manage the offload pipeline 102(*i*) via an offload pipeline interface 102(*h*).

The virtual machines 100(*a*)-(*c*) may be assigned priorities. Priorities mean that the transactions initiated by one virtual machine 100(*a*) may take precedence over transactions initiated by another virtual machine 100(*b*). In some embodiments, the priorities may only take effect when the resources of the I/O adapter device 102 are heavily occupied. Priorities may take the form of service level agreements. A service level agreement may, for example, indicate an amount of resource usage permitted to a virtual machine 100(*a*)-(*c*). For example, service level agreements may indicate that a virtual machine 100(*c*) may only be allowed a certain amount of network bandwidth, host memory, and/or I/O adapter device 102 usage. I/O adapter device 102 usage may involve assigning a certain amount of buffer memory space to each virtual machine; thus, for example, service level agreements may indicate how much buffer memory space a virtual machine 100(*a*)-(*c*) is assigned.

Priorities may also apply to queues maintained by virtual machines 100(*a*)-(*c*). For example, in some embodiments, a virtual device 102(*a*) may provide multiple queues, such as for example paired submission and completion queues. Commands are placed by the virtual machine 102(*a*) into a submission queue. Completions for those commands are placed in the associated completion queue. In some instances, the virtual device 102(*a*) may provide multiple submission queues. Priorities may be assigned to specific queues, or to specific queue pairs, such that transactions in one queue may take precedence over transactions in another queue. In some embodiments, priorities may not take effect until the I/O adapter device's 102 resources are heavily occupied.

Requests from the virtual machines 100(*a*)-(*c*) may be received and handled in the I/O adapter device 102 by an offload pipeline 102(*i*). The offload pipeline 102(*i*) may include a pipeline with individual units or streaming components for managing the steps to prepare and issue the requests to the network interfaces 102(*d*), 102(*g*). The offload pipeline 102(*i*) may also include buffer memory for intermediate storage of data associated with requests from the virtual machines 100(*a*)-(*c*). The offload pipeline 102(*i*) may communicate with the processor cores 102(1) and/or virtual devices 102(*a*), 102(*b*), 102(*e*) running on the processor cores 102(1) over one or more streaming FIFOs 102(*k*). In some instances, the offload pipeline 102(*i*) provides a fast path for servicing certain requests with lower complexity or certain aspects of the request with respect to the processor cores 102(1) executing on the I/O adapter device.

It should be noted that although certain virtual devices are shown as part of the I/O adapter device 102 of FIG. 2 (i.e., virtual processor 102(*a*) and virtual network interface cards B 102(*d*) and C 102(*g*)), embodiments may generally relate to any suitable virtual or physical I/O device. In addition, although in FIG. 2 virtual machines 100(*a*)-(*c*) and virtual devices 102(*a*), 102(*b*) and 102(*e*) have a one-to-one correspondence, in various embodiments a virtual machine may be associated with zero, one, or multiple virtual devices on an I/O adapter device. Furthermore, although FIG. 2 is described with reference to a plurality of virtual machines running on host device 100, it should be noted that in some embodiments host device 100 may run a single, non-virtualized operating system.

Systems including computers and I/O adapter devices may provide hardware and/or software to reduce the latency of transferring data from a storage location to a host device. These systems, however, are provided only as an example of systems that may implement this data transfer latency reduction. The data transfer latency reduction discussed below may be implemented by other systems that include other components.

FIGS. 3-4 illustrate an I/O adapter device configured to process a request, according to some embodiments. FIG. 3 illustrates how a request is transferred from a virtual machine on a host device to the I/O adapter device and sent to a storage location. FIG. 4 illustrates how the requested data is received by the I/O adapter device from the storage location and provided to the host device. It should be understood that for clarity and ease of explanation, the I/O adapter device illustrated in FIGS. 3 and 4 may include additional components not specifically shown.

II. Egress Requests

FIG. 3 illustrates a system 300 for implementing a storage request, where the request may be targeted to a storage location, according to some embodiments. The request may be targeted to a storage device, such as a remote computing device, a network attached storage device, and/or a direct-attached storage device. In some embodiments, the request can be a read request. Also illustrated in FIG. 3 are the initial steps to execute a request. The request is transferred from a virtual machine on a host device 304 to an I/O adapter device 308. In some instances, the request may originate from a virtual machine executing on the host device 304. In some embodiments, the communication channel between the host device 304 and the I/O adapter device 308 may take the form of a PCIe interface; in such embodiments, the host interface 310 may include a PCIe core.

To initiate a request, the virtual machine on the host device 304 posts a request, for example, by allocating buffer space in the host DRAM 306. The data is to be placed in this buffer space. The virtual machine may also write information about the request to host DRAM 306, such as a command descriptor 306a, which may provide information such as the request type, the size of the data to be transferred by the request, and information indicating where in the host DRAM 306 the buffer space is located. In some embodiments, the virtual machine may store a list of one or more host memory descriptors each indicating a host memory page where the data is to be stored. The command descriptor 306a may include information pointing to the location of the PRP list 306b in host DRAM 306.

Next, the virtual machine on the host device 304 may notify the I/O adapter device 308 that it has posted a request. In some embodiments the I/O adapter device 308 may communicate with the host device 304 over a PCIe communication channel. In such embodiments, the notification may take the form of a doorbell write. The doorbell write can be steered to a Transaction Layer Packet (TLP) queue that is associated with a processor 322. Processor 322 can be one of one or more processors included in some embodiments of the I/O adapter device 308. Any of the one or more processors may be designated for specific tasks, such as handling I/O requests from a specific virtual device. Individual processors may be implemented as one or more processing cores such as ARM cores. The processors communicate with the host interface 310 through an interconnect 320. In some embodiments in which the processors are implemented as ARM cores, interconnect 320 can be an AXI interconnect.

After the I/O adapter device 308 has been notified of the posted request, information about the request is transferred from the host device 304 to the I/O adapter device 308 at step 352. For example, processor 322 may fetch the command descriptor 306a from the host DRAM 306. The command descriptor 306a may indicate to processor 322 that the request is a data request, the size of the data being requested, the storage location of the data, and/or where the data is to be placed in the host DRAM 306. In some embodiments, the command descriptor 306a may indicate that the request is associated with PRP list 306b, and that the list of host memory descriptors should be fetched from host DRAM 306. For example, if the size of the data is greater than the page size of the host memory, then the data will be placed in more than one host memory pages, and each host memory descriptor may indicate a host memory page at which a portion of the data is to be stored. At step 354, processor 322 may fetch the list of host memory descriptors from host DRAM 306, and the request may be added to a submission queue for processing for processing by processor 322.

Prior to retrieving the data from the storage location, processor 322 may configure content addressable memory unit 390 to facilitate processing of the request. For example, processor 322 may configure one or more content addressable memory (CAM) entries for the request in CAM unit 390 at step 356. In some embodiments, depending on the size of the data being requested and the payload size of the response packets supported by the storage location and/or I/O adapter device 308, processor 322 may issue one or more request packets to the storage location to service the request. For example, if the data requested by host device 304 is 128 KB, and the packet payload size supported is 8 KB, then processor 322 may issue 16 request packets each requesting 8 KB of data to the storage location. Each CAM entry can be programmed with a key or a unique ID to identify and match up each request packet issued by processor 322 with a corresponding response packet coming back from the storage location.

Referring to FIG. 5, CAM unit 390 may include a CAM memory 391 and a context RAM 392. CAM memory 391 may include multiple CAM entries 391a that can be used by I/O adapter device 308 to service requests. For example, in some embodiments, CAM memory 391 may store CAM entries 391a, where each CAM entry is associated with a context entry in context RAM 392, and each CAM entry contains a unique key that is used for looking up the associated context entry.

Referring to FIG. 6, each key in CAM entry 391a may be configured as a combination of one or more header fields from the header of an expected response packet. For example, the key may include source and destination addresses (or portions thereof), a sequence number, and other header information to uniquely identify a response packet, and the key can be used to match up the response packet with its corresponding request packet. In some embodiments, processor 322 may generate or assign a unique tag (e.g., a counter value, a random number, etc.) for a request packet that processor 322 issues, and this unique tag can be included as part of the request packet (e.g., inserted in the header of the request packet). When the storage location returns the data requested by the request packet in a response packet, the storage location may return this unique tag in the header of the read response packet. As a further example, a request ID associated with the request from host device can be used as a base tag that is provided to the storage device, and a sequence number or counter value that increments for each request packet associated with the request can be combined with the request ID (and/or other header fields) to derive the key in the CAM entry 391a.

In some embodiments, which combination of header fields is used to derive the key can be configurable, and CAM unit 390 may support multiple different configurations defining which combinations of one or more header fields are used to derive a particular key. For example, a set of configuration registers can be used to set which one or more header fields are used to derive a key. The configuration indicating which header fields are used for a particular packet can be selected based on a configurable field in the header. For example, a packet may include a protocol version number, and which combination of header fields are used to derive the key may depend on the value of the protocol version number. In some embodiments, I/O adapter device 308 can be configured to process different types of packets (e.g., TCP, UDP, IP, Ethernet, other proprietary protocol, etc.), and depending on the packet type of the response packet, different combinations of the header fields can be used to derive the key in the CAM entry. For example, a UDP packet may use one combination of header fields, whereas an TCP packet may use a different combination of header fields. It should be noted that a different combination may refer to a different set of header fields and/or a different ordering of how the header fields are combined.

In some embodiments, management of the CAM unit 390 can be handled by hardware implemented in ingress data placement logic. For example, which CAM entry is allocated and de-allocated can be handled automatically by the ingress data placement logic. In some embodiments, this mode of operation can be bypassed, and which CAM entry is allocated or de-allocated can be specified by processor 322. A set of CAM management registers can be used to indicate which CAM entry is in-use, and processor 322 can read or write to the CAM management registers to allocate or de-allocate a CAM entry. For example, in error cases in which a request is taking too long to complete and a request timeout is triggered, processor 322 can write to the CAM management registers to free up the CAM entry associated with the request that timed out.

Referring back to FIG. 5, context RAM 392 may include multiple context entries 392*a* that are each associated with a CAM entry 391*a*. The key in each CAM entry 391*a* can be used as an index to access the associated context entry 392*a*. Each context entry 392*a* may include multiple host memory descriptors indicating a host memory page at which a portion of the data is to be stored. For example, referring to FIG. 7, a host memory descriptor 393 may include an address within a host memory page and a length indicating the length of data to be stored in that host memory page starting at indicated address. The number of host memory descriptors included in each context entry may depend on the data payload size of the response packets and the page size of the host memory. For example, if the data payload size of the response packet is 8 KB and the page size of the host memory is 4 KB, then each context entry may include two host memory descriptors if the data is to be stored in a page aligned manner at the host memory. If the data is to be stored with an offset in the first host memory page, then the number of host memory descriptors included in each context entry can be equal to one plus a result of the data payload size divided by the host memory page size. Thus, in the example above for an 8 KB data payload size and 4 KB host memory page size, each context entry may include three host memory descriptors if the data is to be stored with an address offset.

Referring back to FIG. 3, once processor 322 has set up the CAM entries and associates context entries for the request from the host device, processor 322 may generate one or more egress request packets for sending to the storage location via streaming interconnect 326. Each request packet may contain information about the request, such as the identity of the virtual machine that requested the data, and storage access information for the storage location that contains the data. The header of the request packet may further include protocol information that may be required to transmit the packet, as well as information that the storage device at the storage location can use to generate an appropriate header for the response packet. The payload of the request packet may be empty, or may include auxiliary information to be sent to the storage location. Processor 322 then provides the request packets to streaming interconnect 326 for routing to the MAC 342 towards the storage location.

III. Ingress Responses

Figure 4A:
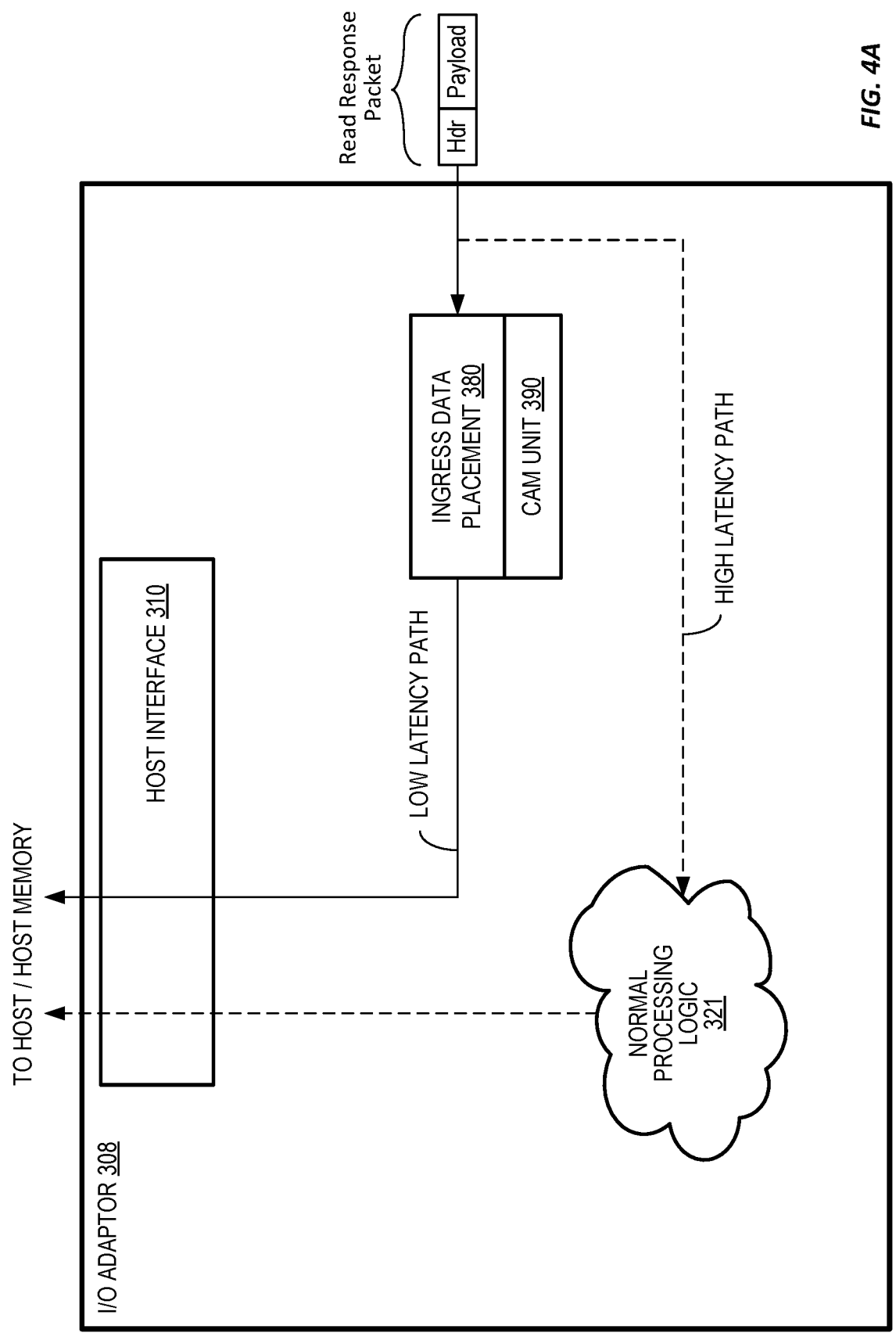
FIG. 4A illustrates a block diagram of a system for further processing of a request, according to some embodiments.

FIG. 4A illustrates an I/O adapter device 308, according to some embodiments. The I/O adapter device 308 may implement ingress data placement circuitry to reduce the latency of placing ingress data to the host memory. In some embodiments, the ingress data placement circuitry may include ingress data placement logic 380 and CAM unit 390. The ingress data placement logic 380 can comprise, for example, circuitry and logic gates to access the CAM unit 390. A response packet may be received from the storage location in response to a corresponding request packet issued by I/O adapter device 308. Instead of providing the response packet to the normal processing logic 321 (e.g., a processor) along the high latency path, the response packet can be processed by the ingress data placement circuitry, and the data payload of the response packet can be placed in the host memory using the low latency path. For example, the ingress data placement logic 380 can retrieve the appropriate host memory descriptors from CAM unit 390, and use the host memory descriptors to place the data payload into the host memory. This allows the normal processing logic 321 (e.g., processor) to be bypassed, and the ingress data placement can be performed without requiring, for example, the processor of the I/O adapter device 308 to perform any direct memory access (DMA) programming. In some situations, the response packet may indicate that an error had occurred. In such cases, the read response packet can be processed by the normal processing logic 321 for proper error handling.

Figure 4B:
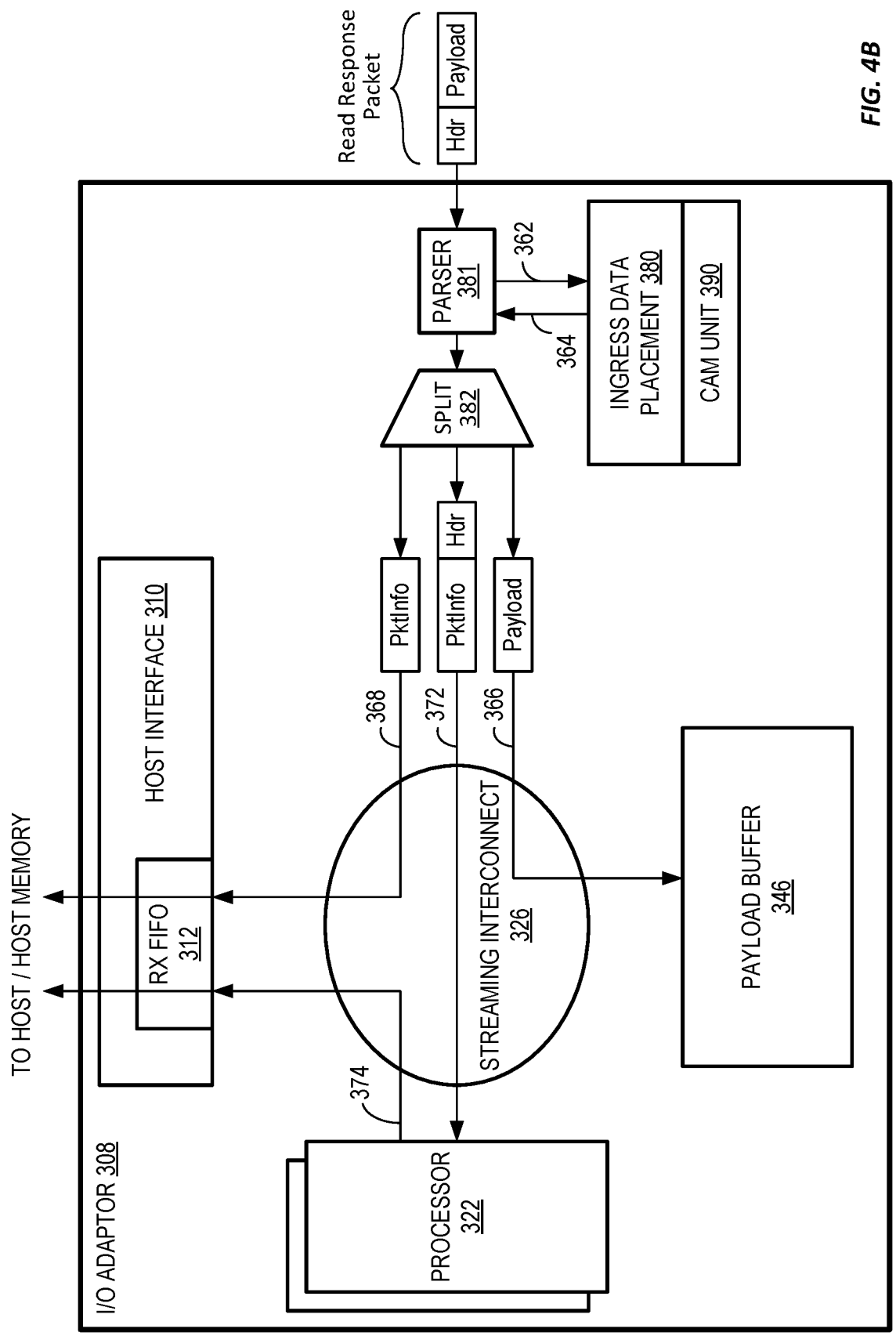
FIG. 4B illustrates a block diagram of a system for further processing of a request, according to some embodiments.

FIG. 4B illustrates additional details of an I/O adapter device 308 implementing ingress data placement circuitry and the steps to process responses from a storage location, according to some embodiments. The ingress data placement circuitry may include one or more of a parser 381, a splitter 382, and ingress data placement logic 380 including CAM unit 390. A response packet may be received from the storage location in response to a corresponding request packet issued by I/O adapter device 308. In some situations, multiple response packets may be received to service one request from the host device. Each response packet may include a header and a data payload that includes at least a portion of the requested data. Alternatively, the response packet may indicate that an error had occurred. In such cases, processor 322 may examine the error. In some cases, processor 322 may inform the virtual machine that requested the data that an error had occurred. In some cases, the processor 322 may handle the error and/or reissue the request packet that generated the error.

When a valid response packet containing at least a portion of the data is received by I/O adapter device 308, parser 381 may parse the response packet to extract and analyze the header of the response packet. Parser 381 may provide the header or a portion thereof to the ingress data placement logic 380 for further processing at step 362. Parser 381 may also derive or obtain response packet metadata (may be referred to as "PktInfo"), and prepend the metadata to the response packet. The response packet metadata may include information about the response packet such as some of the header fields in the header and/or additional information derived from the header fields (e.g., length of packet or data payload, etc.). In some embodiments, the response packet metadata may also include a handle for the response packet which the I/O adapter device 308 uses to identify and track the response packet.

Ingress data placement logic 380 may implement circuitry to parse the header of the response packet received from parser 381 to derive a lookup key, and provide the lookup key to CAM unit 390. The lookup key can be derived from a combination of one or more of the header fields of the received header. For example, the header of the response packet may include a packet type identifier or packet version number, and ingress data placement logic may use the packet type or version number to look up the configuration indicating which combination of one or more header fields should be use to derive the lookup key for the response packet. In some embodiments, other header fields or information (e.g., a tag) can be used to determine the appropriate configuration of header fields for deriving the lookup key.

CAM unit 390 may compare the lookup key with the keys stored in the CAM memory. CAM unit 390 may determine which CAM entry has the key that matches the lookup key of the response packet, and retrieve the context entry associated with that key/CAM entry. The host memory descriptors of the retrieved context entry are then provided to parser 381 at step 364. The host memory descriptors can be included as part of the response packet metadata. In some embodiments, the CAM entry with the matching key and the associated context entry can be automatically de-allocated upon a hit. In some embodiments, the CAM entry and the associated context entry can be manually de-allocated by processor 322 (e.g., by performing a write to the CAM management registers).

Splitter 382 splits the header from the response packet, and steers the header, the data payload, and response packet metadata through streaming interconnect 326 to the appropriate recipient. At step 366, the data payload (may also include the header) can be provided to payload buffer 346 for buffering and temporary storage. At step 368, the response packet metadata (may also optionally include the header) can be steered to the receive FIFO 312 of host interface 310. The response packet metadata provided to host interface 310 may include the host memory descriptors retrieved from CAM unit 390 indicating the host memory locations for placing the data payload. The response packet metadata can also include the handle of the response packet and the length of the response packet or data payload. Host interface 310 may then use the handle of the response packet to retrieve the data payload from payload buffer 346, and transfer the data payload to the host memory according to the host memory descriptors. Accordingly, by utilizing CAM unit 390 to provide the host memory descriptors for the data, the ingress data placement logic can provide the data to the host device with reduced latency by bypassing processor 322.

At step 372, the header and/or response packet metadata or an indication of having received the data payload is provided to processor 322 for completion processing. It should be noted that splitter 382 provides the header to processor 322 after the metadata/header has made it to host interface 310 to ensure that the data packet is provided to the host device before processor 322 issues a completion packet to complete the request. After the last response packet is received for the request, processor 322 may send a completion packet to the receive FIFO 312 of host interface 310 at step 374 to indicate that the request is complete. The completion packet may include all the relevant information (address, length, PCIe, TLP parameters, etc.) for the request. If the CAM entries associated with the request are not automatically de-allocated, processor 322 may manually de-allocate the CAM entries after completion of the request. In some embodiments, instead of having processor 322 send the completion packet, the completion information can be stored in the context entry associated with the CAM entry for the last response packet for the request. In such scenarios, processor 322 can be bypassed completely when processing the response packets from the storage location.

The above description for the processing of requests by an I/O adapter device illustrate embodiments that may implement data transfer latency reduction. As noted above, data retrieved from a storage location can be provide to the host device while bypassing the high latency normal processing of the I/O adapter device (e.g., bypassing the processor of the I/O adapter device). When a response packet is received, the host memory descriptors indicating where the data payload should be written at the host memory can be maintained by a CAM unit such that additional processing cycles for determining the host memory descriptors by the processor of I/O adapter device can be omitted. As a result, requests can be serviced by the I/O adapter device with reduced latency.

FIG. 8 illustrates an example of a format 800 for a packet header, according to some embodiments. A packet header typically provides information about the packets, such as for example a source address of the source of the packet, a destination address for the destination of the packet, information about the contents of the packet, and/or information required by the protocol used to transmit the packet. The format 800 illustrated in FIG. 8 shows one example of header fields that may include additional information about the packet, and can be extended as needed. The format 800 may include a version number field 802. The version number 802 may indicate one among several various available versions of the packet header. The format 800 may also include an operation code, or "opcode" field 804 that indicates the type of operation to be executed by the packet. The format 800 may further include a header length field 806. The header length field 606 may specify the size of the packet header, in either number of bits, number of bytes, number of words (where a word is a certain number of bits long), or number of segments (where a segment is a certain number of bytes, such as a minimum transfer unit (MTU) as used by certain transmission protocols).

The format 800 may further include a number of spare fields 810, 812, and 814. The spare fields may be used for additional information. The additional information may be defined in different ways for different uses of the packet header. For example, the spare fields may be defined differently for different version numbers 802. Alternatively or additionally the spare fields 810 may be defined differently for different opcodes 804. The spare fields may also be used to extend the uses of the packet header. For example, in some implementations a unique tag to identify the packet can be included in one of the spare fields. In some embodiments, any combination of the header fields shown in FIG. 8 and/or additional header fields not specifically shown can be used to derive the key included in a CAM entry. For example, in some embodiments, up to six header fields can be used to derive the CAM entry key. In other embodiments, other number of header fields or portions thereof can be used to derive the CAM entry key.

IV. Methods

Figure 9:
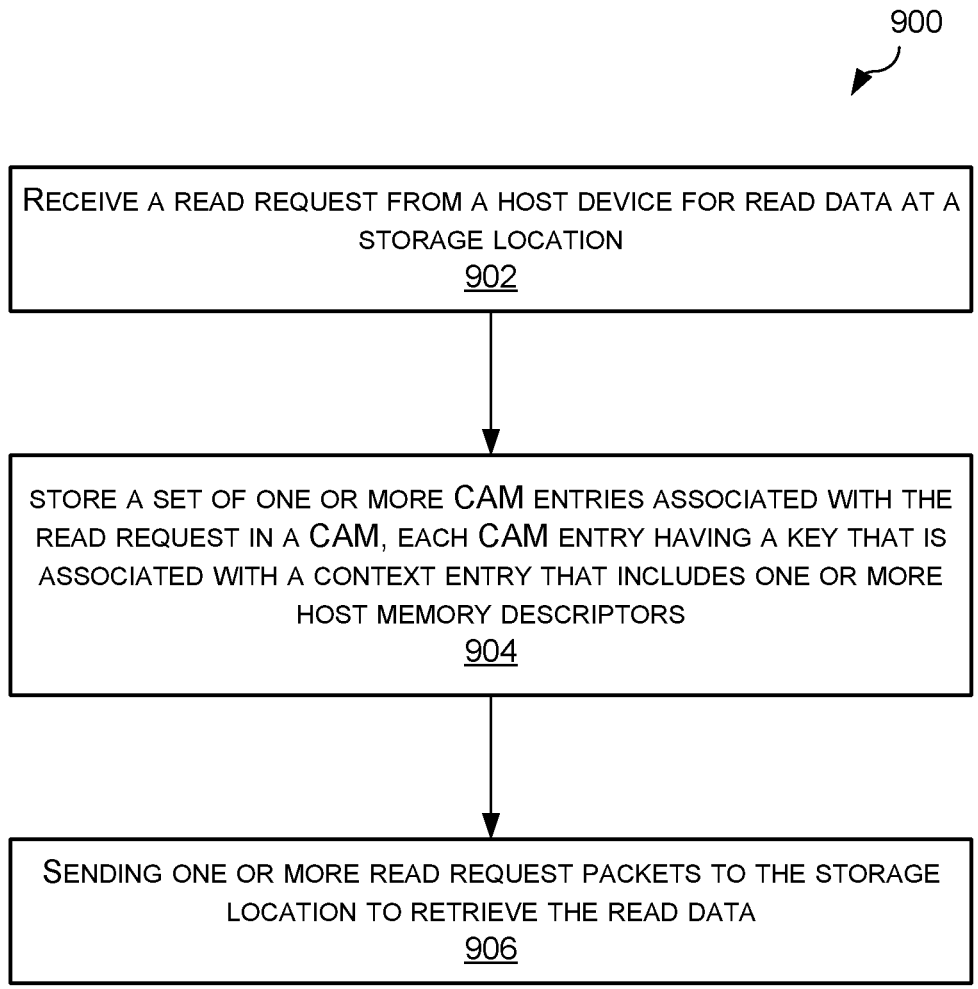
FIG. 9 illustrates a flow diagram of a process for preparing and transmitting request packets, according to some embodiments.
Figure 10:
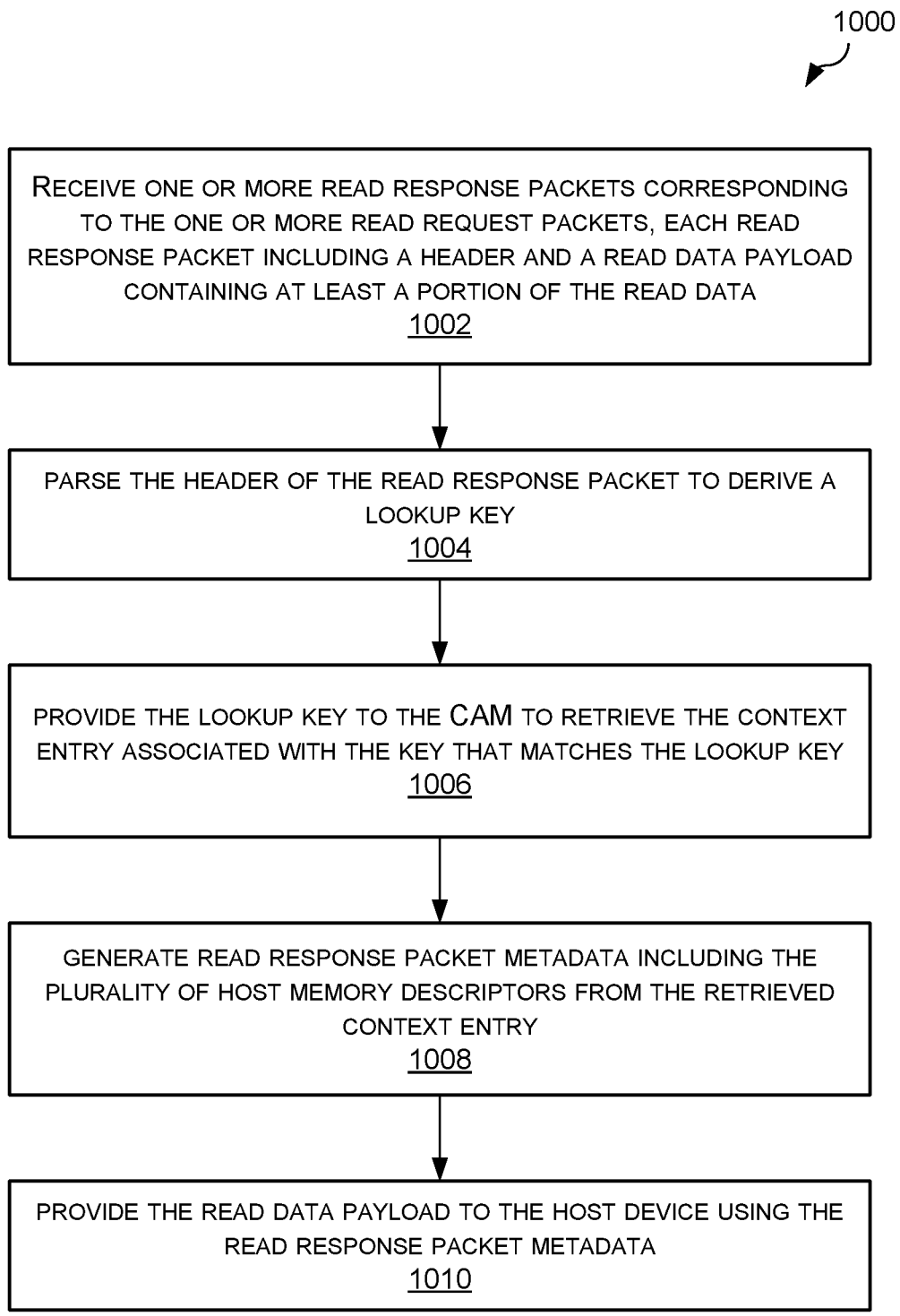
FIG. 10 illustrates a flow diagram of a process for ingress data placement of response packets, according to some embodiments.

FIGS. 9-10 illustrate methods for reducing the data transfer latency, according to some embodiments. These methods may be implemented by the systems described herein.

FIG. 9 illustrates a process 900 for preparing and transmitting request packets for servicing a request from a host device (e.g., a virtual machine executing on a host device), according to some embodiments. In some embodiments, process 900 can be performed by a processor or processing core of an I/O adapter device. At block 902, a request for data at a storage location is received from the host device. At block 904, a set of one or more content addressable memory entries associated with the request is stored in a content addressable memory, each content addressable memory entry having a key that is associated with a context entry that includes one or more host memory descriptors. Each host memory descriptor may indicate a host memory page to store at least a portion of the data payload. In some embodiments, each data payload is of a data payload size, each host memory page is of a host memory page size; and the number of host memory descriptors included in each context entry can be equal to one plus a result of the data payload size divided by the host memory page size. At block 906, one or more request packets are sent to the storage location to retrieve the data.

FIG. 10 illustrates a process 1000 for ingress data placement of response packets received from a storage location, according to some embodiments. In some embodiments, some or all of process 1000 can be performed by ingress data placement logic or circuitry in an I/O adapter device to bypass the high latency path of the I/O adapter device (e.g., bypass the processor of the I/O adapter device). At block 1002, one or more response packets are received. Each response packet may correspond to a previously issued request packet. Each response packet may include a header and a data payload containing at least a portion of the data requested by a host device.

For each of the response packets, the header of the response packet is parsed to derive a lookup key at block 1004. The lookup key can be derived from a combination of one or more header fields in the header of the response packet. In some embodiments, the combination of one or more header fields in the header used to derive the lookup key can be based on a packet type of the response packet. In some embodiments, the combination of one or more header fields in the header used to derive the lookup key can be configurable. In some embodiments, the one or more header fields used to derive the lookup key can also include a tag that the processor sent to the storage location as part of the corresponding request packet.

At block 1006, the lookup key is provided to a content addressable memory to retrieve the context entry associated with the key that matches the lookup key. The context entry may include one or more host memory descriptors. At block 1008, response packet metadata (may also be referred to as "PktInfo") can be generated, and the host memory descriptors from the retrieved context entry can be included as part of the response packet metadata. At block 1010, the data payload is provided to the host device (e.g., virtual machine executing on the host device) using the retrieved context entry or response packet metadata while bypassing the processor of the I/O adapter device. In some embodiments, the response packet metadata and the header of the response packet, or an indication of having received the data payload can be provided to the processor of the I/O adapter device without the data payload.

V. Computer Systems

Figure 11:
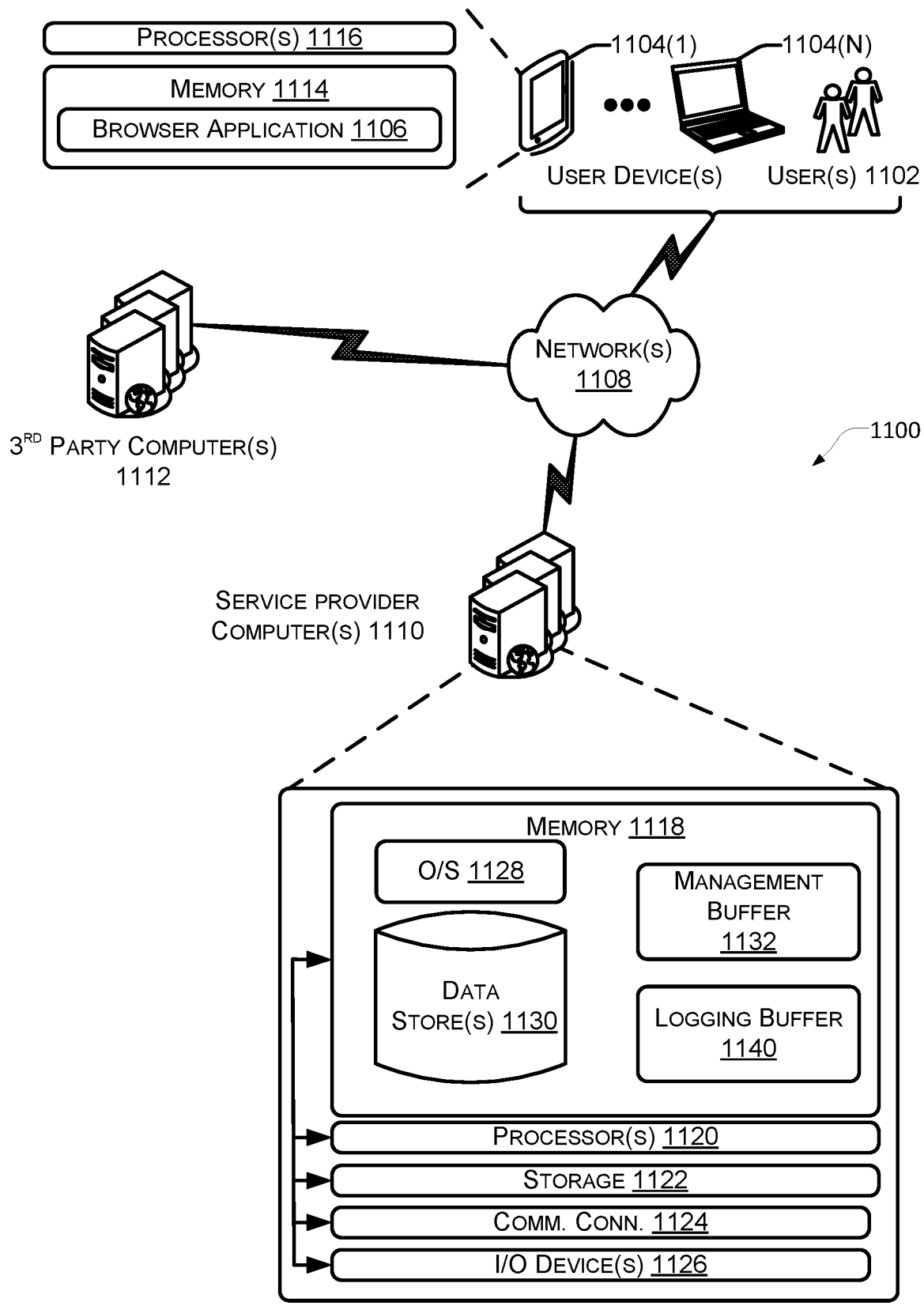
FIG. 11 illustrates an exemplary architecture for features and systems described herein that includes one or more service provider computers and/or a user device connected via one or more networks, according to some embodiments.

FIG. 11 illustrates an exemplary architecture for features and systems described herein that includes one or more service provider computers and/or a user device connected via one or more networks, according to at least one exemplary embodiment. The devices discussed in FIGS. 1-4, may use one or more components of the computing devices described in FIG. 11 or may represent one or more computing devices described in FIG. 11. In the illustrated architecture 1100, one or more users 1102 may use user computing devices 1104(1)-(N) to access an application 1106 (e.g., a web browser or mobile device application), via one or more networks 1108. In some aspects, the application 1106 may be hosted, managed and/or provided by a computing resources service or service provider. One or more service provider computers 1110 may provide a native application which is configured to run on the user devices 1104 which user(s) 1102 may interact with. The service provider computer(s) 1110 may, in some examples, provide computing resources such as, but not limited to, client entities, low latency data storage, durable data storage, data access, management, virtualization, cloud-based software solutions, electronic content performance management, etc. The service provider computer(s) 1110 may also be operable to provide web hosting, computer application development and/or implementation platforms, combinations of the foregoing or the like to the user(s) 1102. The service provider computer(s) 1110, in some examples, may communicate with one or more third party computers 1112.

In some examples, network(s) 1108 may include any one or a combination of many different types of networks, such as cable networks, the Internet, wireless networks, cellular networks and other private and/or public networks. While the illustrated example represents the user(s) 1102 accessing an application 1106 over the network(s) 1108, the described techniques may equally apply in instances where the user(s) 1102 interact with the service provider computer(s) 1110 via user device(s) 1104 over a landline phone, via a kiosk or in any other manner. It is also noted that the described techniques may apply in other client/server arrangements (e.g., set-top boxes, etc.), as well as in non-client/server arrangements (e.g., locally stored applications, etc.).

As described briefly above, the application 1106 may allow the user(s) 1102 to interact with the service provider computer(s) 1110 such as to access web content (e.g., web pages, music, video, etc.). The service provider computer(s) 1110, which may be arranged in a cluster of servers or as a server farm, may host the application 1106 and/or cloud-based software services. Other server architectures may also be used to host the application 1106. The application 1106 may be capable of handling requests from many users 1102 and serving, in response, various item web pages. The application 1106 can provide any type of website that supports user interaction, including social networking sites, online retailers, informational sites, blog sites, search engine sites, news and entertainment sites and so forth. As discussed above, the described techniques can similarly be implemented outside of the application 1106, such as with other applications running on the user device(s) 1104.

The user device(s) 1104 may be any type of computing device such as, but not limited to, a mobile phone, a smart phone, a personal digital assistant (PDA), a laptop computer, a desktop computer, a thin-client device, a tablet PC, an electronic book (e-book) reader, etc. In some examples, the user device(s) 1104 may be in communication with the service provider computer(s) 1110 via the network(s) 1108, or via other network connections. Additionally, the user device(s) 1104 may be part of the distributed system managed by, controlled by or otherwise part of the service provider computer(s) 1110 (e.g., a console device integrated with the service provider computers 1110).

In one illustrative configuration, a user device(s) 1104 may include at least one memory 1014 and one or more processing units (or processor(s) 1116). The processor(s) 1116 may be implemented as appropriate in hardware, computer-executable instructions, firmware, or combinations thereof. Computer-executable instruction or firmware implementations of the processor(s) 1116 may include computer-executable or machine-executable instructions written in any suitable programming language to perform the various functions described. The user device(s) 1104 may also include geo-location devices (e.g., a global positioning system (GPS) device or the like) for providing and/or recording geographic location information associated with the user device(s) 1104.

The memory 1114 may store program instructions that are loadable and executable on the processor(s) 1116, as well as data generated during the execution of these programs.

Depending on the configuration and type of the user device(s) 1104, the memory 1114 may be volatile (such as random access memory (RAM)) and/or non-volatile (such as read-only memory (ROM), flash memory, etc.). The user device(s) 1104 may also include additional removable storage and/or non-removable storage including, but not limited to, magnetic storage, optical disks and/or tape storage. The disk drives and their associated computer-readable media may provide non-volatile storage of computer-readable instructions, data structures, program modules and other data for the computing devices. In some implementations, the memory 1114 may include multiple different types of memory, such as static random access memory (SRAM), dynamic random access memory (DRAM), or ROM.

Turning to the contents of the memory 1114 in more detail, the memory 1114 may include an operating system and one or more application programs or services for implementing the features disclosed herein including at least a user provided input element or electronic service web page, such as via a browser application 1106 or dedicated applications (e.g., smart phone applications, tablet applications, etc.). The browser application 1106 may be configured to receive, store and/or display a website or other interface for interacting with the service provider computer(s) 1110. Additionally, the memory 1114 may store access credentials and/or other user information such as, but not limited to, user IDs, passwords and/or other user information. In some examples, the user information may include information for authenticating an account access request such as, but not limited to, a device ID, a cookie, an IP address, a location or the like. In addition, the user information may include a user-provided response to a security question or a geographic location obtained by the user device 1104.

In some aspects, the service provider computer(s) 1110 may also be any type of computing devices such as, but not limited to, a mobile phone, a smart phone, a personal digital assistant (PDA), a laptop computer, a desktop computer, a server computer, a thin-client device, a tablet PC, etc. Additionally, it should be noted that in some embodiments, the service provider computer(s) 1110 are executed by one or more virtual machines implemented in a hosted computing environment. The hosted computing environment may include one or more rapidly provisioned and released computing resources, which computing resources may include computing, networking and/or storage devices. A hosted computing environment may also be referred to as a cloud computing environment. In some examples, the service provider computer(s) 1110 may be in communication with the user device(s) 1104 and/or other service providers via the network(s) 1108, or via other network connections. The service provider computer(s) 1110 may include one or more servers, perhaps arranged in a cluster, as a server farm, or as individual servers not associated with one another. These servers may be configured to implement the keyword classification and rating feature services described herein as part of an integrated, distributed computing environment.

In one illustrative configuration, the service provider computer(s) 1110 may include at least one memory 1118 and one or more processing units (or processor(s) 1120). The processor(s) 1120 may be implemented as appropriate in hardware, computer-executable instructions, firmware or combinations thereof. Computer-executable instruction or firmware implementations of the processor(s) 1120 may include computer-executable or machine-executable instructions written in any suitable programming language to perform the various functions described.

In some instances, the hardware processor(s) 1120 may be a single core processor or a multi-core processor. A multi-core processor may include multiple processing units within the same processor. In some embodiments, the multi-core processors may share certain resources, such as busses and second or third level of cache between multiple-cores. In some instances, each core in a single or multi-core processor may also include multiple executing logical processors (or threads). In such a core (that supports multiple logical processors), several stages of the execution pipeline and also lower level caches may also be shared.

The memory 1118 may store program instructions that are loadable and executable on the processor(s) 1120, as well as data generated during the execution of these programs. Depending on the configuration and type of the service provider computer(s) 1110, the memory 1118 may be volatile (such as RAM) and/or non-volatile (such as ROM, flash memory, etc.). The service provider computer(s) 1110 or servers may also include additional storage 1122, which may include removable storage and/or non-removable storage. The additional storage 1122 may include, but is not limited to, magnetic storage, optical disks and/or tape storage. The disk drives and their associated computer-readable media may provide non-volatile storage of computer-readable instructions, data structures, program modules and other data for the computing devices. In some implementations, the memory 1118 may include multiple different types of memory, such as SRAM, DRAM, or ROM.

The memory 1118, the additional storage 1122, both removable and non-removable are all examples of computer-readable storage media. For example, computer-readable storage media may include volatile or non-volatile, removable or non-removable media implemented in any method or technology for storage of information such as computer-readable instructions, data structures, program modules or other data. The memory 1118 and the additional storage 1122 are all examples of computer storage media. Additional types of computer storage media that may be present in the service provider computer(s) 1110 may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, or any other medium which can be used to store the desired information and which can be accessed by the service provider computer(s) 1010. Combinations of any of the above should also be included within the scope of computer-readable media.

Alternatively, computer-readable communication media may include computer-readable instructions, program modules or other data transmitted within a data signal, such as a carrier wave or other transmission. However, as used herein, computer-readable storage media does not include computer-readable communication media.

The service provider computer(s) 1110 may also contain communications connection(s) 1124 that allow the service provider computer(s) 1110 to communicate with a stored database, another computing device or server, user terminals and/or other devices on the network(s) 1108. The service provider computer(s) 1110 may also include I/O device(s) 1126, such as a keyboard, a mouse, a pen, a voice input device, a touch input device, a display, speakers, a printer and the like.

The memory 1118 may include an operating system 1128, one or more data stores 1130 and/or one or more application programs or services for implementing the features disclosed herein, including a management buffer 1132 and a logging buffer 1140. The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 11, and/or functions described herein can be provided by one or more modules that exist as separate modules and/or module functions described herein can be spread over multiple modules.

Figure 12:
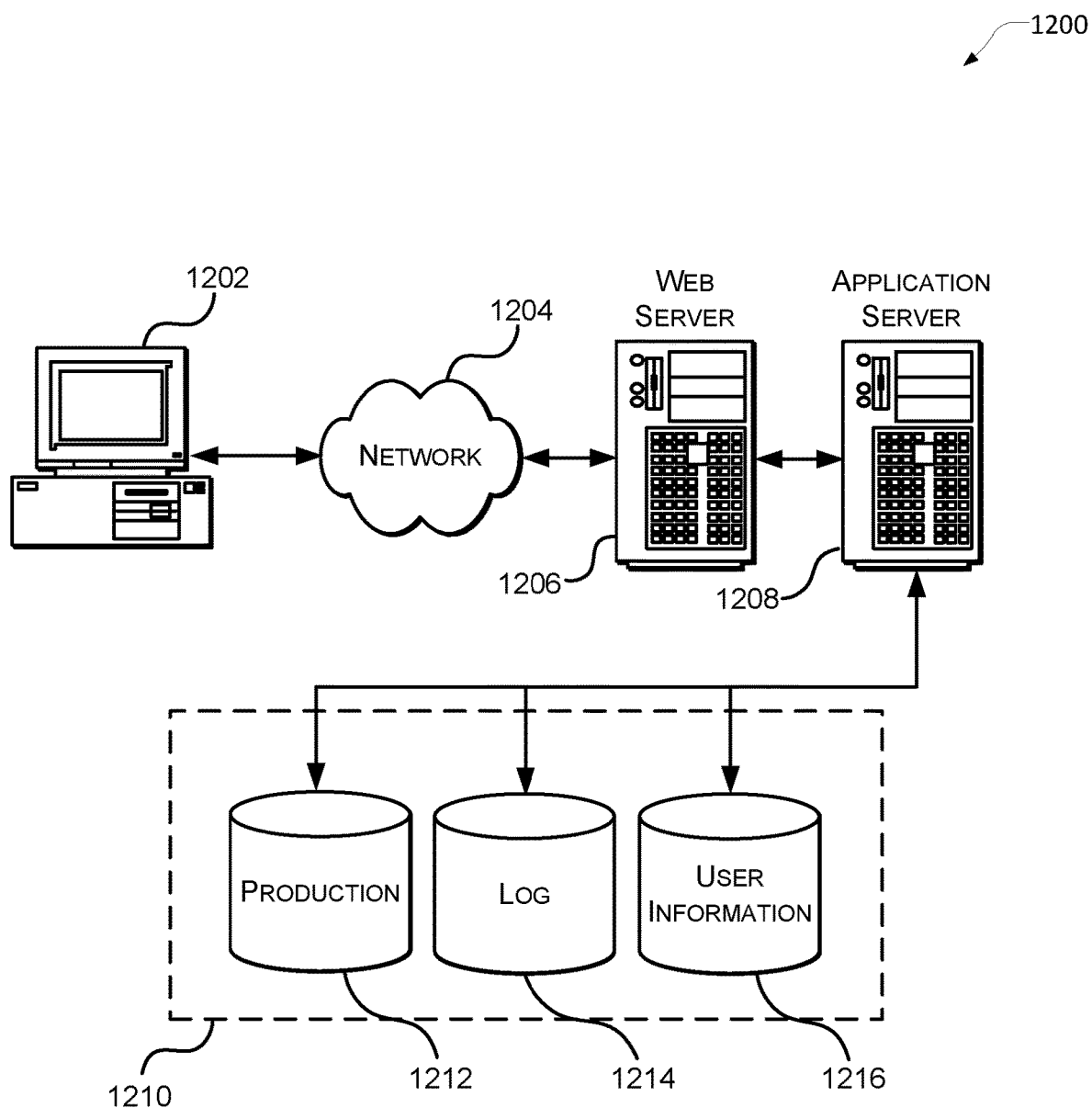
FIG. 12 illustrates an example environment for implementing various aspects, according to some embodiments.

FIG. 12 illustrates aspects of an example environment 1200 for implementing aspects in accordance with various embodiments. As will be appreciated, although a Web-based environment is used for purposes of explanation, different environments may be used, as appropriate, to implement various embodiments. The environment includes an electronic client device 1202, which can include any appropriate device operable to send and receive requests, messages or information over an appropriate network 1204 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 1206 for receiving requests and serving content in response thereto, although for other networks an alternative device serving a similar purpose could be used as would be apparent to one of ordinary skill in the art.

The illustrative environment includes at least one application server 1208 and a data store 1210. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 1202 and the application server 1208, can be handled by the Web server. It should be understood that the Web and application servers are not required and are merely example components, as structured code discussed herein can be executed on any appropriate device or host machine as discussed elsewhere herein.

The data store 1210 can include several separate data tables, databases or other data storage mechanisms and media for storing data relating to a particular aspect. For example, the data store illustrated includes mechanisms for storing production data 1212 and user information 1216, which can be used to serve content for the production side. The data store also is shown to include a mechanism for storing log data 1214, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 1210. The data store 1210 is operable, through logic associated therewith, to receive instructions from the application server 1208 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 1202. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 18. Thus, the depiction of the system 1100 in FIG. 18 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk®. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including Hypertext Transfer Protocol ("HTTP") servers, FTP servers, Common Gateway Interface ("CGP") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C # or C++, or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An I/O device comprising:
    a memory comprising a plurality of entries, the memory configured to store multiple host memory descriptors in each entry, each host memory descriptor indicating a memory page at which data is to be stored;
    one or more processors configured to:
        receive, from a host device, a request for data at a storage location;
        store a key for the request in an entry of the memory, the key being associated with a plurality of host memory descriptors stored in the entry; and
        send a request packet to the storage location to retrieve the data; and
    data placement circuitry configured to:
        receive, from the storage location, a response packet corresponding to the request packet, the response packet including the data being requested;
        retrieve the plurality of host memory descriptors by:
            selecting a set of data elements to use to determine a lookup key, wherein the selection of the set of data elements is configurable;
            determining the lookup key using the set of data elements; and
            providing the lookup key to the memory to retrieve the plurality of host memory descriptors associated with the key that matches the lookup key; and
        provide the data to the host device using the retrieved plurality of host memory descriptors.

2. The I/O device of claim 1, wherein the lookup key is determined by combining a base tag with a sequence number.

3. The I/O device of claim 2, wherein the base tag is a request identifier associated with the request.

4. The I/O device of claim 3, wherein the request identifier is included in a header of the request packet.

5. The I/O device of claim 1, wherein at least one of the data elements being used to determine the lookup key is included in a header of the response packet.

6. The I/O device of claim 1, wherein the set of data elements is determined based on a network protocol.

7. The I/O device of claim 1, wherein determining the set of data elements includes determining an order in which the data elements are combined.

8. The I/O device of claim 1, wherein information indicating which set of data elements to use is stored in a configuration register.

9. The I/O device of claim 1, wherein the data placement circuitry is further configured to bypass the one or more processors when providing the data to the host device using the retrieved plurality of host memory descriptors.

10. The I/O device of claim 1, wherein the memory is a content addressable memory.

11. A computer-implemented method comprising:
    receiving, by a communication device and from a host device, a request for data at a storage location;
    storing, by the communication device, a key for the request in an entry of a memory, the key being associated with a plurality of host memory descriptors stored in the entry, wherein each entry of the memory is configured to store multiple host memory descriptors, each host memory descriptor indicating a memory page at which a portion of the data is to be stored;
    sending, by the communication device, a request packet to the storage location to retrieve the data;
    receiving, by the communication device, a response packet corresponding to the request packet, the response packet including the data being requested;
    selecting, by the communication device, a set of data elements to use to determine a lookup key, wherein the selection of the set of data elements is configurable;
    determining, by the communication device, the lookup key using the set of data elements;
    retrieving, by the communication device, the plurality of host memory descriptors using the lookup key; and
    providing, by the communication device, the data to the host device using the retrieved plurality of host memory descriptors.

12. The computer-implemented method of claim 11, wherein the lookup key is determined by combining a base tag with a sequence number.

13. The computer-implemented method of claim 12, wherein the base tag is a request identifier associated with the request.

14. The computer-implemented method of claim 13, wherein the request identifier is included in a header of the request packet.

15. The computer-implemented method of claim 11, wherein at least one of the data elements being used to determine the lookup key is included in a header of the response packet.

16. The computer-implemented method of claim 11, wherein the set of data elements to use is determined based on a network protocol.

17. The computer-implemented method of claim 11, wherein determining the set of data elements includes determining an order in which the data elements are combined.

18. The computer-implemented method of claim 11, wherein information indicating which set of data elements to use is stored in a configuration register.

19. The computer-implemented method of claim 11, wherein a processing core of the communication device is bypassed when the data is being provided to the host device using the retrieved plurality of host memory descriptors.

20. A system comprising:
    a host device including one or more host processors; and
    an adapter device coupled to the host device, the adapter device including:

a controller;

a memory comprising multiple entries, wherein each entry is configured to store multiple host memory descriptors, each host memory descriptor indicating a memory page at which data is to be stored; and data placement circuitry configured to:
- select a set of data elements to use to determine a lookup key associated with a plurality of host memory descriptors for data requested by the host device, wherein the selection of the set of data elements is configurable;
- determine the lookup key using the set of data elements;
- provide the lookup key to the memory to retrieve the plurality of host memory descriptors; and
- provide the data to the host device using the retrieved plurality of host memory descriptors while bypassing the controller.

* * * * *